(12) United States Patent
Takiar et al.

(10) Patent No.: US 6,384,397 B1
(45) Date of Patent: May 7, 2002

(54) LOW COST DIE SIZED MODULE FOR IMAGING APPLICATION HAVING A LENS HOUSING ASSEMBLY

(75) Inventors: Hem Takiar, Fremont; Ashok Prabhu; Luu Nguyen, both of Sunnyvale, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 63 days.

(21) Appl. No.: 09/634,138

(22) Filed: Aug. 8, 2000

Related U.S. Application Data

(63) Continuation-in-part of application No. 09/618,747, filed on Jun. 29, 2000.
(60) Provisional application No. 60/203,417, filed on May 10, 2000, and provisional application No. 60/219,176, filed on Jul. 19, 2000.

(51) Int. Cl.$^7$ ............................................. H01L 27/00
(52) U.S. Cl. ..................... 250/208.1; 250/239; 250/216
(58) Field of Search .............................. 250/208.1, 239, 250/214.1, 216; 257/291, 431–435; 396/79, 80

(56) References Cited

U.S. PATENT DOCUMENTS 5,668,665 A * 9/1997 Choate ....................... 359/663

OTHER PUBLICATIONS

Press Release by PixelCam, Inc., "PixelCam, Inc. Announces Industry's First Complete Imaging Module", May 1, 2000, Campbell, California, 3 pages.
Circuit image downloaded from website www.pixelcam.com/images/ebkzoom, downloaded Feb. 24, 2000, 1 page.
Circuit image downloaded from website www.pixelcam.com/images/pixelinkzoom, downloaded Feb. 24, 2000, 1 page.

* cited by examiner

*Primary Examiner*—Que T. Le
(74) *Attorney, Agent, or Firm*—Beyer Weaver & Thomas, LLP

(57) ABSTRACT

An imaging sensor module assembly adapted to be mounted to a substrate for use in electronic imaging devices. The imaging sensor includes an optical lens, and a sensor package having a sensor surface containing an optical detector portion. The sensor further includes a plurality of sensor contacts in electrical communication with the optical detector portion. A flex circuit includes a plurality of circuits terminating at respective terminals electrically coupled to a corresponding sensor contact. The module assembly further includes a lens housing assembly configured to support the optical lens, and a barrel portion adapted to fixedly couple to the sensor package. This coupling orients the lens a predetermined focal length from the sensor package such that light waves passing through the lens are focused onto the optical detector portion.

17 Claims, 5 Drawing Sheets

LOW COST DIE SIZED MODULE FOR IMAGING APPLICATION HAVING A LENS HOUSING ASSEMBLY

CROSS REFERENCE TO RELATED APPLICATIONS

This is a continuation-in-part application of co-pending prior application Ser. No. 09/618,747, filed Jun. 29, 2000 (Our Ref: NSC1P169), which claims priority from Provisional Application, Application Ser. No. 60/219,176, filed Jul. 19, 2000 (Our Ref: NSC1P188P), which also claims priority from Provisional Application No. 06/203,417, filed May 10, 2000 (Our Ref: NSC1P169P) the disclosure of which is incorporated herein by reference.

FIELD OF THE INVENTION

The present invention relates generally to imaging sensors, and more specifically, to imaging sensor module assemblies for digital imaging applications.

BACKGROUND

Imaging devices are used to capture still and video images which then can be transformed into analog or digital formats. For example, imaging devices are commonly used in digital cameras, personal computer cameras and other imaging applications. The primary components of an imaging device are an optical lens, a lens housing, an imaging sensor and a printed circuit board. The optical lens receives and focuses light from the environment to be captured onto the imaging sensor. The lens housing is critical for securely positioning the lens over the imaging sensor so that the captured light may be properly focused onto the imaging sensor. The imaging sensor is connected to a printed circuit board in order to be electrically connected to the rest of the imaging system.

The current method of assembling an imaging device generally involves attaching the lens housing and the imaging sensor directly to the printed circuit board. The optical lens is inserted into the lens housing after these components are attached. Examples of current imaging device assemblies are illustrated in FIGS. 1 and 2. In FIG. 1 an optical lens 10, which is secured by an interior lens housing 11, is positioned over an imaging sensor 14 by an external lens housing 12. Both the imaging sensor 14 and the external lens housing 12 are attached to a printed circuit board 16. The imaging sensor 14 is connected to the printed circuit board 16 by solder ball electrical contacts 15 and has optical sensors on its top surface. The exemplary assembly illustrated in FIG. 2 is similar to that shown in FIG. 1 except for a few variations. First, a plate of glass 20 is attached to the external lens housing 12 in order to protect the imaging sensor 14 from dust particles, moisture, etc. Also, the imaging sensor 14 is connected to the printed circuit board by wire bond interconnects 17, rather than by solder ball electrical contacts 15 (see FIG. 1).

Unfortunately, there are various aspects of the current imaging device assembly that are undesirable. The first aspect involves the assembly steps which must be subject to rigorous process controls to ensure that the lens is centered, leveled and placed at a proper distance with respect to the imaging sensor. Implementation of these process controls adds complexity, time and costs to the assembly process. Secondly, the numerous components making up the imaging device reduces the ability to have components created in standard sizes and forms so that future designs and implementations may be created more simply. Finally, because a large area is occupied when a lens housing is attached to the printed circuit board, it is difficult to design smaller devices in accord with the constant desire in the electronics industry for miniaturization.

In view of the foregoing concerns, an improved concept for components which may be assembled into an imaging device would be desirable. Such components and their assembly should allow for faster and easier assembly, modularity and standardization of the components, and facilitate design requirements aimed at miniaturizing imaging devices.

SUMMARY

The present invention is directed to an imaging sensor module assembly adapted to be mounted to a substrate for use in electronic imaging devices. The module assembly includes an optical lens, and a sensor package having a sensor surface containing an optical detector portion. The sensor further includes a plurality of sensor contacts in electrical communication with the optical detector portion. A flex circuit includes a plurality of circuits terminating at respective terminals electrically coupled to a corresponding sensor contact. The module assembly further includes a lens housing assembly configured to support the optical lens, and a barrel portion adapted to fixedly couple to the sensor package. This coupling orients the lens a predetermined focal length from the sensor package such that light waves passing through the lens are focused onto the optical detector portion.

In one embodiment, the sensor contacts, which could be solder bumps, of the sensor package are positioned on the sensor surface, generally adjacent the detector portion. The flex circuit is thus mounted to the top side and connected to the contacts.

In another configuration, the housing assembly includes support housing adapted to couple to the barrel portion thereof. The housing assembly defines a cavity formed for aligned receipt of the sensor package therein at an aligned orientation positioning the optical detector portion the sensor package at the predetermined focal length from lens such that light waves passing through the lens are focused onto the optical detector portion. The support housing includes a support surface defining an access opening into the cavity. The support surface is adapted to support the barrel portion thereon such that the light waves pass through the port and onto the sensor package detector portion.

In one arrangement, the support housing includes alignment walls defining an alignment slot portion of the cavity. When the sensor device is received in the slot portion, the alignment walls cooperate with the sensor device to receivably align the optical detector portion thereof with the lens.

BRIEF DESCRIPTION OF THE DRAWINGS

The assembly of the present invention has other objects and features of advantage which will be more readily apparent from the following description of the best mode of carrying out the invention and the appended claims, when taken in conjunction with the accompanying drawing, in which:

DETAILED DESCRIPTION OF THE INVENTION

Figure 1:
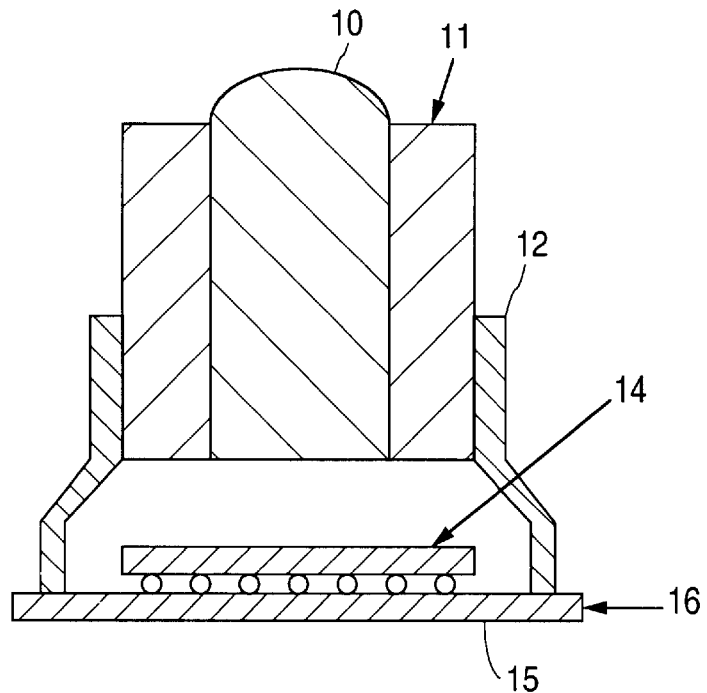
FIG. 1 is a side elevation view, in cross-section, of a prior art imaging sensor device illustrating mounting to a substrate device.
Figure 2:
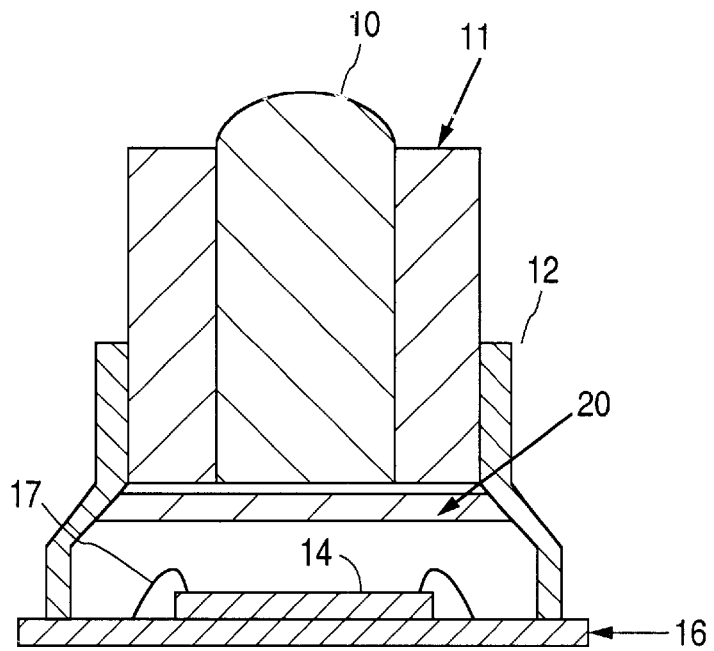
FIG. 2 is a side elevation view, in cross-section, of another prior art imaging sensor device illustrating mounting to a substrate device.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 3:
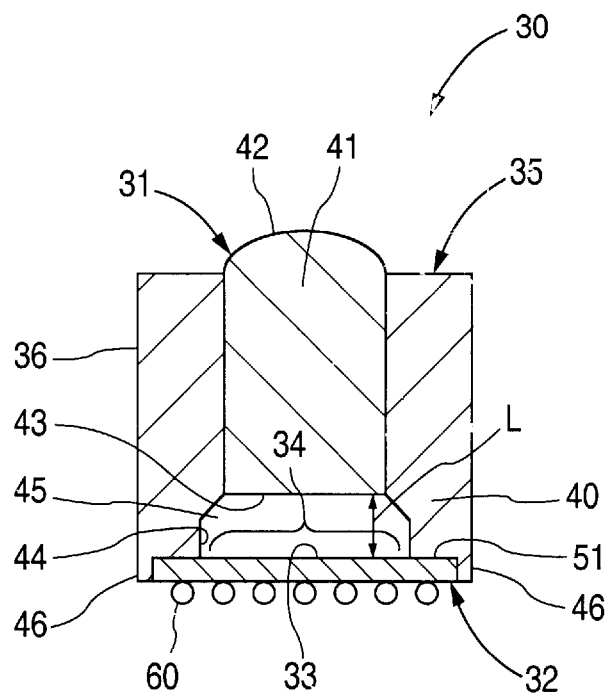
FIG. 3 is a side elevation view, in cross-section, of an imaging sensor module assembly constructed in accordance with the present invention.
Figure 4:
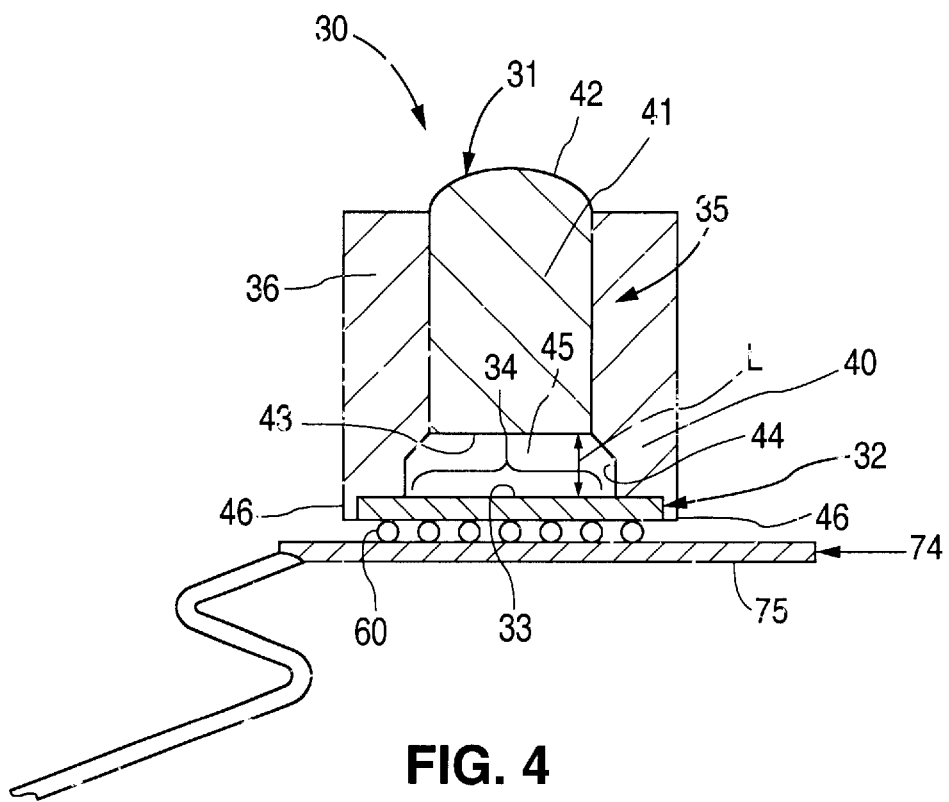
FIG. 4 is a side elevation view, in cross-section, of the imaging sensor module assembly of FIG. 3 mounted to a laminate substrate.

Attention is now directed to FIGS. 3 and 4 where to an imaging sensor module assembly, generally designated 30, is illustrated for use in electronic imaging devices. The module assembly 30 includes an optical lens 31, and a sensor package 32 having a sensor surface 33 containing an optical detector portion 34. The module assembly 30 further includes a lens housing assembly, generally designated 35, having a support portion 36 configured to support the lens 31, and includes base portion 40 adapted to fixedly mount to the sensor package 32 in a manner positioning the lens 31 a predetermined focal length L from the sensor package 32 such that light waves passing through the lens 31 are focused onto the optical detector portion 34.

Accordingly, a sensor module assembly is provided incorporating the lens and the sensor package into a single module which prepositions the lens at the predetermined focal length from the sensor package. This arrangement is substantially advantageous since this module assembly can be simply mounted to the substrate, usually a Printed Circuit Board (PCB), of the electronic imaging device. Consequently, component supply and manufacture at the electronic imaging module level are substantially reduced since the costly, time consuming and labor intensive step of mounting and calibrating the lens a predetermined focal length from the sensor package is performed at the lens assembly level. This preformed component is then supplied in a imaging sensor modular form which can then be simply installed without calibrating and setting the focal length. Moreover, product reliability can be increased, while the overall structural footprint of the assembly can be reduced, an advantage in product miniaturization.

Figure 8:
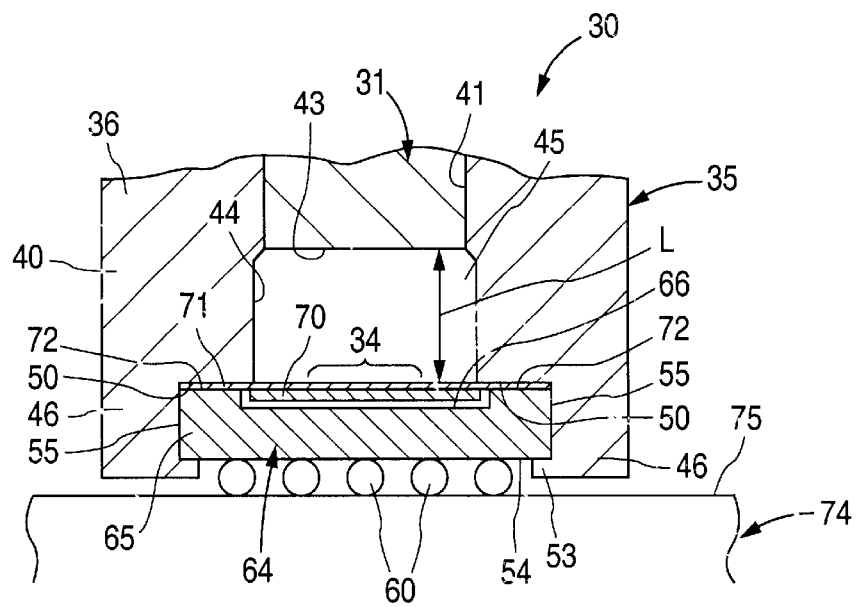
FIG. 8 is an enlarged, fragmentary, side elevation view, in cross-section, of a cavity-type sensor package mounted to the housing assembly of the present invention.

Briefly, it will be appreciated that the sensor package 32 may be provided by any packaged imaging sensor having a physical structure capable of being attached to the lens housing. One embodiment of the packaged imaging sensor capable of being attached to the lens housing is a cavity package, as illustrated in FIG. 8 and to be discussed in greater detail below. An alternative embodiment of the packaged imaging sensor is a glass Chip-Scaled Package (CSP). Both may be employed in any digital imaging applications such as digital video cameras, still digital cameras, personal computer digital cameras, PDAs, notebooks, robotics, surveillance systems, cellular phones, document imaging, etc.

As best viewed in FIG. 3, the lens housing assembly 35 includes a support portion 36 defining a socket 41 adapted to support the optical lens therein. Typically, the optical lens 31 is cylindrical in shape having a capture end 42, for capturing light into the lens, and a transmission end 43, for transmitting the light from the capture end 42 to the sensor package 32. To supportively secure the optical lens 31 to the housing, the diameter of the housing socket 41 is substantially similar to that of the optical lens. A tolerance in the range of between about 0.0005 inch to about 0.001 inch may be provided for mounting and adjustment purposes.

The lens 31 is preferably mounted to the lens housing assembly 35 through conventional adhesives such as one-part epoxies. Alternatively, the lens 31 may be press or friction-fit into the socket of the housing support portion 36, or may include a threaded portion (not shown) for threaded mating with the socket 41.

Extending downwardly from the support portion 36 of the housing assembly 35 is the base portion 40 which is adapted to fixedly mount to the sensor package 32. The base portion 40 includes an interior wall 44 defining a recess 45 formed for receipt of the sensor surface 33 of the sensor package 32 at an entrance thereof. This recess 45 enables unobstructed passage of the transmitted light from the transmission end 43 of the lens 31 to the optical detector portion 34 of the sensor package 32. The recess 45 is preferably cylindrical in shape to conform to the transverse cross-sectional shape of the lens 31, as well as to the peripheral edge of the sensor surface 33. Accordingly, the interior walls 44 should not obstruct the passage of light from the lens transmission end 43 to the optical detector portion 34.

The recess 45 is preferably substantially empty to provide an air medium therein for the passage of light from the transmission end 43 to the sensor surface of the sensor package. However, it will be appreciated that the recess may be filled with a transparent material such as optically clear epoxy or silicon gel.

The support portion 36 and the base portion 40 of the housing assembly 35 are preferably integrally formed with one another through convention injection molding techniques. Moreover, the housing assembly 35 is preferably composed of a moldable material such as plastic or the like. Examples of some injection moldable plastics that can be used for module fabrication include polycarbonate, ABS (acrylonitrile butadiene styrene), nylon, acetal, thermoplastic polyester, liquid crystal polymer, etc.

Briefly, while the base portion 40 is preferably provided by a single structure extending continuously around the peripheral edge portion of the sensor surface 33 of the sensor package 32, it will be appreciated that the base portion may be collectively provided by a plurality of spaced-apart leg portions (not shown). In this manner, each leg may be distally mounted to the sensor package at regions peripheral to the sensor surface 33.

Figure 5:
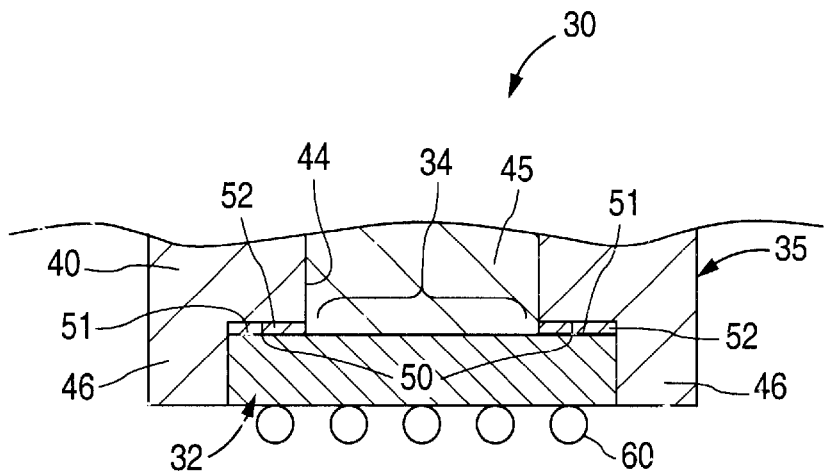
FIG. 5 is an enlarged, fragmentary, side elevation view, in cross-section, of the imaging sensor module assembly of FIG. 3 illustrating an adhesive mount to the sensor package.
Figure 6:
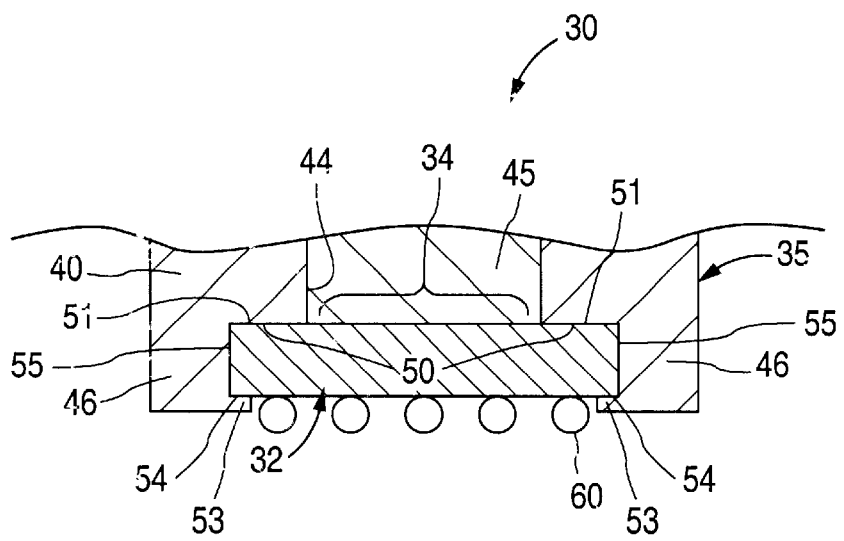
FIG. 6 is an enlarged, fragmentary, side elevation view, in cross-section, of an alternative snap fit mount to the sensor package.
Figure 7:
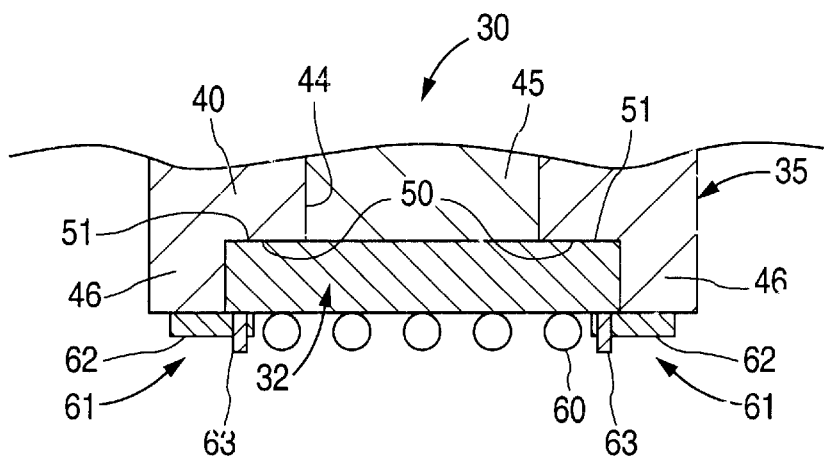
FIG. 7 is an enlarged, fragmentary, side elevation view, in cross-section, of an alternative clip mount to the sensor package.

Referring now to FIGS. 5–7, the downwardly depending base portion 40 includes a distal mounting portion 46 adapted to fixedly mount the housing assembly 35 to the sensor package 32. The mounting portion 46 includes a support shoulder 50 formed to supportively seat against a top peripheral surface 51 of the sensor package. In one embodiment (FIG. 5), the mounting portion 46 includes an adhesive material 52 or the like applied between the support shoulder 50 and the top peripheral surface 51 for mounting thereto. This adhesive material may be provided by any conventional adhesive applied in this field such as epoxies. Once the adhesive material 52 is applied therebetween, and the lens housing assembly 35 is adjusted to center and position the lens relative the optical detector portion 34 of the sensor package 32, the adhesive is allowed to cure for fixed mounting. Briefly, the centering and spacing of the lens 31 from the sensor package 32 may be adjusted by the amount of adhesive in the connecting joint, or by the application of conventional shims and/or a set screws. These adjusting and calibration techniques are standard in the industry, and may be applied in all embodiments henceforth.

In another alternative configuration, the mounting portion 46 may be provided through a friction-fit technique. As best illustrated in FIG. 6, the mounting portion 46 may include a lip portion 53 adapted to engage an underside surface 54 of the sensor package in a manner press-fit or friction-fit around the peripheral edge portion 55 of the package. The peripheral edge 55, thus, is sandwiched between the upper shoulder portion 50 and the lower lip portion 53. In this embodiment, the lip portion and/or the base portion may not extend continuously around the peripheral edge 56 of the sensor package since it would be difficult to press-fit the package into the mounting portion 46 in this manner. Thus, the mounting portions 46 may only be provided on the two opposed sides of the sensor package, or may be provided by a plurality of spaced-apart leg portions as above-mentioned.

To assure that the lip portions 53 of the mounting portion 46 will not interfere with the mounting of the module assembly 30 to the PCB substrate (FIG. 4), the height of the lip portion 53 must not exceed that of the solder balls 60 of the BGA. Since the solder balls 60 are typically on the order of about 150 μm to about 200 μm in height, the height of the lip portions are preferably in the range of about 75 μm to about 150 μm in height, and more preferably about 100 μm in height.

It will be appreciated that although only BGA sensor package applications are described and illustrated, the present invention may be applied to other non-BGA sensor packages as well, such as array-like Chip Scale Packages (CSPs).

Referring now to FIG. 7, the mounting portion 46 includes a clip device 61 cooperating with the distal base portion 40 to mount the sensor package 32 in the entrance into the recess 45. In this configuration, the clip device 61 may include a plurality of clips 62 and a corresponding set screws 63 spaced apart about the peripheral edge, and which cooperatively mount the package to the housing assembly 35. These clips 62 may be easily manipulated to install and move the clips over the backsides of the sensor package and the underside of the base portion.

In accordance with the present invention, the base portion 40 is designed to position the lens 31 a predetermined focal length L from the optical detector portion 34 and the sensor surface 33 of the sensor package 32 when the package is fixedly mounted to the housing assembly 35. This predetermined focal length L, therefore, is dependent upon the type of lens applied as well as the type of sensor package. For example, such length varies from about 0.25 inch to about 0.5 inch in the current state of the art designs.

By increasing or decreasing the length of the base portion 40, the focal length L can of course be adjusted. Thus, when the housing assembly 35 is mounted to the sensor package 32, the predetermined focal length L can be preset and fixed at the lens/sensor assembly level for greater reliability and for ease of installation of the sensor module as a unit. Thus, the advantage to the end customer is the simple board surface mounting of the module without further lens alignment, leveling, and calibration as required in current state of the art designs. By way of example, as best viewed in FIG. 8, the sensor package 32 may be provided by cavity package 64 having a rigid molded substrate 65 defining a cavity 66. A die 70, having a plurality of photodiode optical detectors 34, is positioned in the rigid substrate cavity. A transparent glass lid 71 extends laterally across a top surface 72 of the rigid substrate to enclose the die 70 in the cavity 66 to protect the die from dust particles, moisture, etc. At an opposed lower surface 54 is a Ball Grid Array (BGA) of solder balls 73 which are adapted to surface mount to a PCB substrate. The die is electrically connected by interconnects to the electrical leads of the solder balls. The module assembly can then be simply mounted to the PCB substrate using conventional Surface Mounting Techniques (SMT). Consequently, manufacture time and costs are substantially reduced.

In another aspect of the present invention, a method of fabricating an imaging sensor module assembly 30 is provided for use with electronic imaging device 74. The method includes providing a housing assembly 35 defining a support portion 36 and a base portion 40 extending downwardly from the support portion 36, and supporting an optical lens 31 on the support portion 36 of the housing assembly 35. The method further includes fixedly mounting the base portion 40 to a sensor package 32, having a sensor surface 33 containing an optical detector portion 34. The housing assembly 35 is mounted in a manner positioning the lens 31 a predetermined focal length L from the sensor package 32 such that light waves passing through the lens 31 are focused onto the optical detector portion 34.

In one method configuration, the method includes operably affixing the sensor package 32 and the housing assembly 35, as a unit (i.e., the imaging sensor module assembly 30), to a PCB substrate 75 of the electronic imaging device 74 for operable use thereof.

Figure 9:
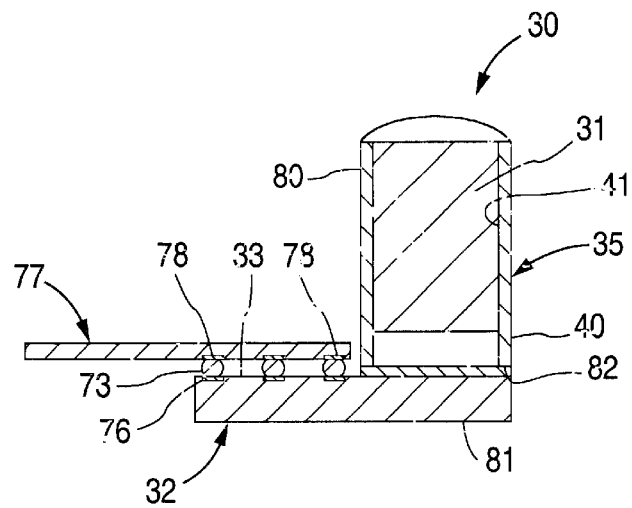
FIG. 9 is a side elevation view, in cross-section, of another imaging sensor module assembly constructed in accordance with the present invention.
Figure 10:
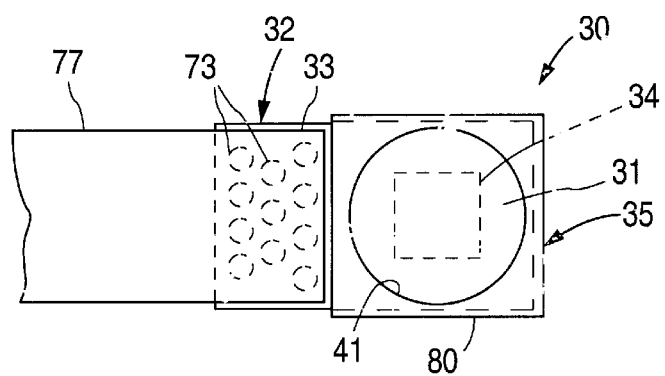
FIG. 10 is a top plan view of the imaging sensor module assembly of FIG. 9 mounted to a laminate substrate.

In yet another aspect of the present invention, referring now to FIGS. 9–10, the present invention is directed to another imaging sensor module assembly 30 adapted to be mounted to a substrate (not shown). The module assembly 30 includes an optical lens 31, and a sensor package 32 having a sensor surface 33 containing an optical detector portion 34. The sensor package 32 includes a plurality of sensor contacts 76 which electrically communicate with the optical detector portion 34. These sensor contacts would be solder bumps formed using standard bumping techniques used in the industry. Techniques like standard convection/IR reflow or localized reflow methods like laser or Hot bar reflow may be used.

Additionally, a flex circuit, generally designated 77, includes a plurality of circuits terminating at respective terminals 78 electrically coupled to a corresponding sensor contact 76. The module assembly 30 further includes a lens housing assembly 35 configured to support the optical lens 31, and a barrel portion 80 adapted to fixedly couple to the sensor package 32. This coupling orients the lens 31 a predetermined focal length from the sensor package 32 such that light waves passing through the lens are focused onto the optical detector portion 34.

Accordingly, a flex circuit is electrically connected and mounted directly to the sensor package, such as a CMOS or CCD sensor device, or a CSP sensor package, for increased flexibility in comparison to the standard, relatively rigid, laminate substrates. Moreover, this arrangement is beneficial in that it reduces the collective height, footprint and weight of the imaging sensor module. Also the tolerances are significantly improved by having the lens directly on the device. In addition, the optics is now integrated directly into the module which reduces not only the cost but also the process steps for the end user as they only have to deal with the connection of the flex to their system.

As best viewed in FIG. 10, the sensor package 32 includes a plurality of exposed sensor contacts 76 positioned on the sensor surface 33, generally adjacent the detector portion 34. These sensor contacts 76 face upwardly in the same general direction as the optical detector portion 34. Hence, the bottom surface 81 of the sensor package is free of any mounting interference which may be caused by the bottom mounted contacts, enabling the sensor package to be mounted directly to a support surface (not shown) of a substrate for improved height reduction.

In the preferred embodiment, the sensor contacts 76 of the sensor package 32 include solder balls 73 (i.e. solder bumped) to facilitate electrical connection to the corresponding circuits of the flex circuit. The patterned bumps correspond to that of the terminals of the flex circuit for corresponding electrical contact thereof. Moreover, the formation of the solder bumps is preferably performed at the wafer fabrication level prior to singulation of the individual dies or sensor packages using standard bumping techniques (electroplating, stencil printing, etc.). The singulation may be performed using standard sawing techniques.

Subsequently, the flex circuit or cable can be electrically attached to the upper sensor surface 33 using conventional reflow processes. Included in these processes are standard reflow techniques such as convection and IR, and localized reflow processes, such as laser reflow or a hot bar reflow method.

Similar to the previous embodiments, the barrel portion 80 preferably defines a cylindrical-shaped socket 41 extending longitudinally therethrough which is formed for mounting receipt of the lens 31. This barrel portion is preferably rectangular in the transverse cross-section dimension (FIG. 10), and includes a base portion 40 adapted for fixed mounted directly to the sensor surface 33. The base portion 40 is aligned relative to the optical detector portion 34 so that the lightwaves collected by the lens contact the detector portion. Thus, the base portion 40 is centered peripherally about the detector portion in a manner enabling unimpeded passage through the lens 31 and socket 41, and onto the detector portion 34.

The base portion 40 may be directly mounted to the sensor package 32 using the same techniques above-mentioned (i.e., clips, friction fit or adhesive). In the preferred embodiment, however, the bottom surface 82 of the barrel portion 80 is adhered to the opposed sensor surface 33 peripherally surrounding the optical detector portion 34. Convention epoxy based adhesives or the like may be applied.

Figure 11:
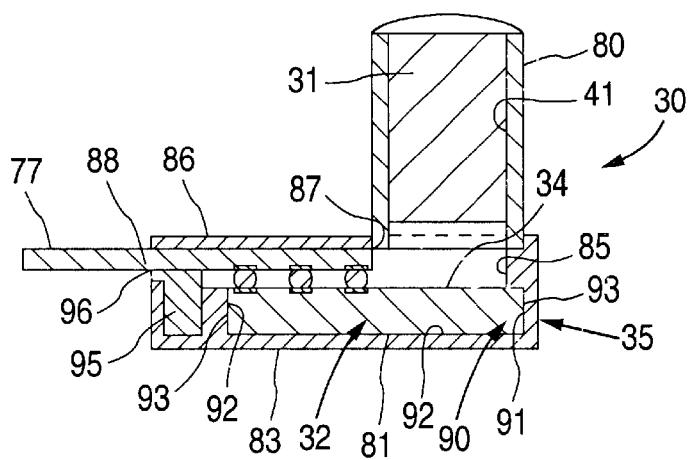
FIG. 11 is a side elevation view, in cross-section, of yet another imaging sensor module assembly constructed in accordance with the present invention.
Figure 12:
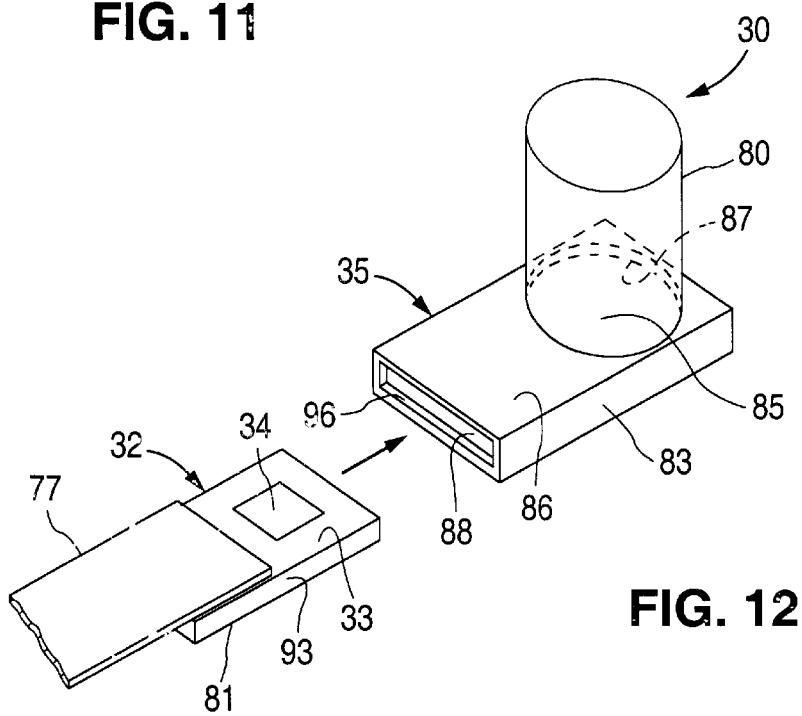
FIG. 12 is a top perspective view of the imaging sensor module assembly of FIG. 11 prior to insertion of the sensor package into the support housing.
Figure 13:
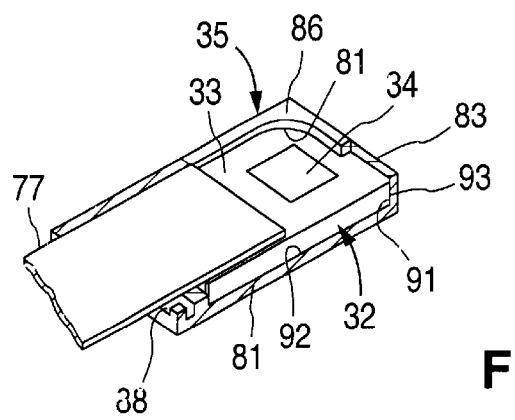
FIG. 13 is a top perspective view of the imaging sensor module assembly of FIG. 11, partially cutaway, to illustrate the seated alignment of the sensor package in the cavity of the support housing.

Turning now to FIGS. 11–13, in another embodiment, the housing assembly 35 includes a support housing or base portion 83 which defines a cavity 85 formed for mounting receipt of the sensor package 32 and the sensor surface mounted flex circuit 77 combination therein. Briefly, in this configuration, the barrel portion 80 supporting the lens is fixedly mounted to the support housing 83. In accordance with this embodiment of the present invention, the sensor package 32 and the support housing cooperate to align the optical detector portion at the predetermined focal length from the lens such that light waves passing through the lens are focused onto the optical detector portion.

Accordingly, the optical detector portion of the sensor package is automatically aligned at the focal point of the mounted lens when the package is properly mounted to the support housing. This substantially simplifies the alignment of the optical components, since alignment automatically occurs during assembly.

FIGS. 11 and 12 illustrate that an upper surface 86 of the support housing 83 provides an access opening 87 into the cavity 85 which enables the lightwaves passing through the lens 31 to enter into the cavity 85. Hence, the barrel portion 80 is positioned peripherally about or in the access opening 87 at a predetermined central location aligning the lens with the anticipated position of the optical detector portion when the sensor package is mounted to the support housing 83. In the preferred embodiment, the support housing 83 and the barrel portion 80 of the housing assembly are preferably composed of a moldable polymer material, such as plastic. Thus, the support housing 83 and the barrel portion 80 may be formed as a unitary piece through the application of injection molding techniques or the like. The lens 31 can then be mounted in the threaded socket 41 of the barrel portion 80 to a vertical positioned focusing the lens at the anticipated position of the sensor package detector portion 34. It will be appreciated, however, that the barrel portion 80 and the support housing 83 may be composed of two independent pieces which are fixedly coupled together, through adhesives, clips or friction fit, without departing from the true spirit and nature of the present invention.

As shown FIG. 12, the support housing 83 includes a receiving port 88 extending into the cavity 85 which is sized and dimensioned for receipt of the transverse cross-sectional dimension of the sensor package 32 therethrough. Upon sliding receipt of the sensor package 32 and the sensor surface mounted flex circuit 77 combination, the sensor package cooperates with an alignment device 90 which aligns the optical detector portion 34 at the focal point of the lens when the sensor package 32 is mounted to the support housing. The alignment device 90 includes vertical alignment walls 91 and horizontal alignment walls 92 thereof, defining portions of the cavity 85, which function to guide the sensor package 32 into alignment.

Accordingly, once the sensor package 32 is inserted through the receiving port 88, the package is mechanically aligned and seated into the cavity 85 as the side walls 93 and the bottom surface 81 of the package contact the corresponding vertical alignment walls 91 and the horizontal alignment walls 92, respectively, of the support housing 83 (FIG. 13). As indicated, such contact positively aligns the center of optical detector portion 34 at the focal point of the lens.

Applying a low temperature die attach material between the opposed walls of the sensor package 32 and the housing assembly, the sensor package 32 and flex circuit 77 can be affixed in place. Examples of suitable low temperature die attach materials include typical epoxy based materials from various suppliers.

In an alternative embodiment, an encapsulant 95 may be applied at the receiving port 88 to seal the support housing cavity 85, and thus protecting the optical detector portion 34, from dust, moisture and other contamination. As shown in FIG. 11, the encapsulant 95 is positioned at the receiving port 88 between the flex circuit 77 and the interior wall portions 96 of the support housing defining the receiving port 88. These encapsulants may include silica filled epoxy materials.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An imaging sensor module assembly adapted to be mounted to a substrate for use in electronic imaging devices comprising:
    a sensor package having a sensor surface containing an optical detector portion and a plurality of sensor contacts in electrical communication with the optical detector portion;
    a flex circuit having a plurality of circuits terminating at respective terminals electrically coupled to a corresponding sensor contact;
    an optical lens; and
    a lens housing assembly configured to support the lens, and having a barrel portion adapted to fixedly couple to the sensor package in a manner positioning the lens a predetermined focal length from the sensor package such that light waves passing through the lens are focused onto the optical detector portion.

2. The module assembly as recited in claim 1, wherein said barrel portion defining a socket formed and dimensioned for mounting receipt of the lens therein.

3. The module assembly as recited in claim 1, wherein said barrel portion is configured to fixedly mount proximate to the sensor surface peripherally about the optical detector.

4. The module assembly as recited in claim 3, wherein said barrel portion includes an adhesive material to adhere the barrel portion to the sensor surface of the sensor package.

5. The module assembly as recited in claim 3, wherein said barrel portion is configured to friction fit to the sensor package.

6. The module assembly as recited in claim 2, wherein said lens is adapted for threaded mounting in the socket.

7. The module assembly as recited in claim 2, wherein said lens and said socket are cylindrical-shaped.

8. The module assembly as recited in claim 1, wherein said sensor contacts are positioned on said sensor surface, generally adjacent to said detector portion.

9. The module assembly as recited in claim 1, wherein said sensor contacts include solder bump mounts.

10. The module assembly as recited in claim 1, wherein said sensor package includes a die containing the optical detector portion.

11. The module assembly as recited in claim 10, wherein said sensor package is a CMOS sensor device.

12. The module assembly as recited in claim 10, wherein said sensor package is a CCD sensor device.

13. The module assembly as recited in claim 10, wherein said sensor package is one of a CSP sensor package and a bumped sensor device.

14. The module assembly as recited in claim 2, wherein said housing assembly includes a support housing adapted to couple to the barrel portion thereof, and defining a cavity formed for aligned receipt of the sensor package therein at an aligned orientation positioning the optical detector portion the sensor package at the predetermined focal length from lens such that light waves passing through the lens are focused onto the optical detector portion.

15. The module assembly as recited in claim 14, wherein said support housing includes a support surface defining an access opening into said cavity, said support surface being adapted to support the barrel portion thereon such that said light waves pass through said opening and onto the sensor package detector portion.

16. The module assembly as recited in claim 15, wherein said support housing further includes an receiving port into said cavity, formed and dimensioned for said aligned receipt of said sensor package therethrough.

17. The module assembly as recited in claim 16, wherein said support housing further includes alignment walls cooperating with said sensor package to receivably align the optical detector portion thereof with said lens.

* * * * *